United States Patent
Odier et al.

(10) Patent No.: US 8,633,138 B2
(45) Date of Patent: *Jan. 21, 2014

(54) METHOD FOR DEPOSITING OXIDE FILMS ON TEXTURED METAL PIPES

(75) Inventors: Philippe Odier, Claix (FR); Stéphanie Morlens, Grenoble (FR); Cyril Millon, Grenoble (FR); Tristan Caroff, Montbonnot St. Martin (FR); Carmen Jimenez, Grenoble (FR); Jean-Louis Soubeyroux, Voreppe (FR); Arnaud Allais, Lyons (FR); Mark Rikel, Huerth (DE)

(73) Assignee: Centre National de la Recherche Scientifique, Paris Cedex (FR)

(*) Notice: Subject to any disclaimer, the term of this patent is extended or adjusted under 35 U.S.C. 154(b) by 114 days.

This patent is subject to a terminal disclaimer.

(21) Appl. No.: 13/139,947

(22) PCT Filed: Dec. 18, 2009

(86) PCT No.: PCT/FR2009/001448
§ 371 (c)(1),
(2), (4) Date: Sep. 12, 2011

(87) PCT Pub. No.: WO2010/076428
PCT Pub. Date: Jul. 8, 2010

(65) Prior Publication Data
US 2011/0312500 A1    Dec. 22, 2011

(30) Foreign Application Priority Data
Dec. 18, 2008 (FR) .................................. 08 07113

(51) Int. Cl.
H01L 39/24    (2006.01)
(52) U.S. Cl.
USPC ........................................ 505/446

(58) Field of Classification Search
USPC ..................... 505/236–237, 446, 510; 427/62
See application file for complete search history.

(56) References Cited

U.S. PATENT DOCUMENTS

| 5,217,754 A | 6/1993 | Santiago-Aviles et al. |
| 5,945,162 A | 8/1999 | Senateur et al. |

(Continued)

FOREIGN PATENT DOCUMENTS

| EP | 1 916 720 A | 4/2008 |
| EP | 2 012 373 A1 | 1/2009 |

(Continued)

OTHER PUBLICATIONS

Hawsey, R.A., et al., "Development of Biaxially Textured $YB_aCu_3O_7$ coated conductors in the U.S.", Oak Ridge National Laboratory, Oak Ridge, Tennessee.

(Continued)

*Primary Examiner* — Colleen Dunn
(74) *Attorney, Agent, or Firm* — McCarter & English, LLP

(57) ABSTRACT

Method of depositing a buffer layer of epitaxial metal oxide on a functionalised surface of a textured metal substrate, said method comprising the following steps:
(1) a layer is deposited of a precursor of an oxide of the type $A_{2-x}B_{2+x}O_7$ where A represents a metal of valency 3 or a mixture of several of these metals, and B a metal of valency 4, and x is a number between −0.1 and +0.1, from a solution of carboxylates of said metals A and B,
(2) said layer of oxide precursor is left to dry,
(3) heat treatment is carried out in order to pyrolyse said oxide precursor and to form the oxide, at least part of said heat treatment being carried out under a flow of reducing gas.

19 Claims, 3 Drawing Sheets

(56) References Cited

U.S. PATENT DOCUMENTS

| | | | |
|---|---|---|---|
| 6,001,416 | A | 12/1999 | Moriyama et al. |
| 6,077,344 | A | 6/2000 | Shoup et al. |
| 6,086,957 | A | 7/2000 | Boyle et al. |
| 6,270,908 | B1 | 8/2001 | Williams et al. |
| 6,440,211 | B1 | 8/2002 | Beach et al. |
| 6,451,450 | B1 | 9/2002 | Goyal et al. |
| 6,537,689 | B2 | 3/2003 | Schoop et al. |
| 6,663,976 | B2 | 12/2003 | Beach et al. |
| 7,261,776 | B2 | 8/2007 | Rupich et al. |
| 2002/0134300 | A1 | 9/2002 | Beach et al. |
| 2007/0026247 | A1 | 2/2007 | Paranthaman et al. |
| 2007/0179063 | A1 | 8/2007 | Malozemoff et al. |
| 2007/0197045 | A1 | 8/2007 | Backer et al. |
| 2007/0197395 | A1 | 8/2007 | Kodenkandath et al. |
| 2008/0039330 | A1 | 2/2008 | Wolf et al. |
| 2008/0113869 | A1 | 5/2008 | Selvamanickam et al. |
| 2008/0119365 | A1 | 5/2008 | Allais et al. |

FOREIGN PATENT DOCUMENTS

| | | |
|---|---|---|
| WO | WO 93/08838 | 5/1993 |
| WO | WO 95/02711 | 1/1995 |
| WO | WO 2006/015819 A1 | 2/2006 |
| WO | WO 2007/004820 A1 | 1/2007 |
| WO | WO 2008/078852 A1 | 7/2008 |
| WO | WO 2009/044938 A2 | 4/2009 |

OTHER PUBLICATIONS

Odier, P., et al., "New YBCO superconducting wires obtained from narrow textured tubes", Superconductor Science and Technology, 22 125024 (5pp), Oct. 23, 2009, IOP Publishing.

Maher, E., et. al., "Multi-layer coated conductor cylinders—an alternative approach to superconducting coil fabrication", Superconductor Science and Technology, 17, Nov. 2, 2004, pp. 1440-1445, Institute of Physics Publishing.

Guibadj, A., "Realisation de multicouches pour supraconducteurs a haute temperature critique par methode chimique", Pd.D. Thesis, Universite Joseph Fourier de Genoble et Universite Hadj Lakhdar de Batna (Algerie), Sep. 28, 2009.

International Search Report for International Application No. PCT/FR2009/001448, dated May 21, 2010.

International Preliminary Report on Patentability w/English translation of Written Opinion of the International Searching Authority for International Application No. PCT/FR2009/001448, dated Jul. 5, 2011.

Yu, Z M et al., "La2Zr2O7 films on Cu-Ni alloy by chemical solution deposition process", Materials Science and Engineering, Jun. 15, 2006, pp. 126-131, vol. 130, No. 1-3, Lausanne, Switzerland.

Teranishi, R. et al., "Growth mechanism of Y123 film by MOD-TFA process", Oct. 1, 2002, pp. 1033-1038, North-Holland Publishing, Amsterdam, Netherlands.

Knoth, et al., "Detailed investigations on La2Zr2O7 buffer layers for YBCO-coated conductors prepared by chemical solution deposition", Dec. 16, 2006, pp. 517-529, Acta Materialia, Oxford, Great Britain.

He, Qing, et al., "Deposition of biaxially-oriented metal and oxide buffer-layer films on textured Ni tapes: new substrate for high-current, high-temperature superconductors", Physica C, 1997, vol. 275, pp. 155-161.

Goyal, et al., "Using RABiTS to Fabricate High-Temperature Superconducting Wire", JOM, Jul. 1999, pp. 19-23.

Soubeyroux, J.L., et al., "Industrial Fe-Ni alloys for HTS coated conductor tapes", Journal of Physics, Conference Series 97, 2008.

Goyal, et al., "Recent progress in the fabrication of high-JC tapes by epitaxial deposition of YBCO on RABiTS", Physica C, 2001, vol. 357-360, pp. 903-913.

Knoth, K., et al., "Growth of thick chemical solution derived pyrochlore La2Zr2O7 buffer layers for YBa2Cu2O7-x coated conductors", Thin Solid Films, 2008, vol. 516, pp. 2099-2108.

Villaume, A. et al., "In situ strain and transport magneto-optical investigations in superconductors", Superconductor Science and Technology, 2008, vol. 21.

Caroff, et al., "La2Zr2O7 single buffer layer for YBaCuO RABiTS coated conductors", Superconductor Science and Technology, 2008, vol. 21.

Freyhardt, H.C., et al., "YBaCuO Thick Films on Planar and Curved Technical Substrates", IEEE Transactions on Applied Superconductivity, 1997, vol. 7, No. 2, pp. 1426-1431.

Canton!, C., et al., "RHEED Studies of Epitaxial Oxide Seed-Layer Growth on RABiTS Ni(001): The Role of Surface Structure and Chemistry", http://arxiv.org/abs/cond-mat/0106254v1, submitted Jun. 13, 2001.

Knoth, et al., "Highly textured La2Zr2O7 buffer layers for YBCO-coated conductors prepared by chemical solution deposition", Superconductor Science and Technology, 2005, vol. 18., pp. 334-339.

Donet, et al., "YBCO coated nickel-based tapes with various buffer layers", J. Phys IV, Pr. 11, pp. 319-323, 2001.

Foltyn, S.R., et al., "Overcoming the barrier to 1000 a/cm with superconducting coatings", Applied Physics Letters 87, 2005.

Tixador, T., et al., "Thermal-electromagnetic modeling of superconductors", Cryogenics 47, pp. 539-545, 2007.

Sickafus, K.E., et al., "Radiation-induced amorphization resistance and radiation tolerance in structurally related oxides", nature materials, Mar. 2007, vol. 6, pp. 217-223.

METHOD FOR DEPOSITING OXIDE FILMS ON TEXTURED METAL PIPES

FIELD OF THE INVENTION

The present invention relates to the field of devices that are superconducting at high temperature, that is to say to electrical devices incorporating ceramic materials, in particular of the $YBa_2Cu_3O_{7-x}$ type (referred to as YBaCuO), which show superconductivity at the temperature of liquid nitrogen.

The present invention concerns chemical methods allowing the epitaxy of thin films of oxides on round metal substrates with low millimetric diameters. These films serve both as a chemical barrier for preventing the diffusion of the metal in the layer of superconductor YBaCuO, and as a matrix for the epitaxy of superconducting layers.

More particularly, the present invention concerns a method for the formation by chemical method of buffer layers by the epitaxy of films of oxides on metal substrates before the deposition of the ceramic of the YBaCuO type.

PRIOR ART

Ceramic materials of the YBaCuO type (also referred to as YBCO) make it possible to manufacture superconducting devices at the temperature of liquid nitrogen. These devices comprise a substrate, in general metal, on which a layer of YBaCuO is deposited, for example by an epitaxy method for depositing YBaCuO from a gaseous phase as described in the documents WO 95/02711 and U.S. Pat. No. 5,945,162 (Centre National de la Recherche Scientifique). It is constantly wished to improve the current densities that can be transported by such devices. This limit is related to the rapid fall-off in the critical current density $J_c$ when the thickness of the YBaCuO layers is increased. This is described for example in the article "*Overcoming the barrier to 1000 A/cm width superconducting coatings*" by S. R. Foltyn et al, appearing in Applied Physics Letters 87 (16), 162505 (2005). The presence of crystallographic defects, which become more frequent when the thickness of the YBaCuO films increases, is one of the factors that appears to contribute to this fall off. YBaCuO films, deposited in general by an epitaxial method, must have a crystallographic structure as close as possible of that of a monocrystal; this involves in particular the alignment of the grains in two perpendicular directions. It is essential to minimise the crystallographic defects thereof (such as dislocations at the grain joins) and defects in crystallographic orientation between the grains. To promote the crystalline growth of the epitaxial layers of YBaCuO, it would be desirable to deposit them on a suitable monocrystalline substrate. However, such substrates are expensive. In practice, and with a view to applications on a large scale, YBaCuO films are therefore deposited on biaxially textured metal substrates.

Biaxially textured metal substrates can be obtained by a specific rolling method with thorough work hardening followed by recrystallisation annealing; these generally flat-shaped substrates are known to persons skilled in the art by the acronym RABiTS ("Rolling-Assisted Biaxially Textured Substrates"). They are described for example in the article "*Deposition of biaxially-oriented metal and oxide buffer-layer films on textured Ni tapes: new substrate for high-current, high-temperature superconductors*" by Qing He, D. K. Christen et al (appearing the journal Physica C 275 (1997), p. 155-161), in the article "*Using RABiTS to Fabricate High-Temperature Superconducting Wire*" by a Goyal et al (appearing in the journal JOM (July 1999), p. 19-23), in the article "*Industrial Fe—Ni alloys for HTS coated conductor tapes*" by J. L. Soubeyroux et al (appearing in the Journal of Physics, Conference Series 97 (2008), 012069, and in the article "*Recent progress in the fabrication of high-JC tapes by epitaxial deposition of YBCO on RABiTS*" by A. Goyal et al (appearing in the journal Physica C 357-360 (2001), p, 903-913).

However, according to the chemical nature of the substrate, it may be necessary to deposit a buffer layer between the metal surface of the substrate and the YBaCuO ceramic in order to prevent the metal of the substrate diffusing in the YBaCuO ceramic and the metal of the substrate forming an oxide the growth of which interferes with the crystallography of the surface. This is for example the case with nickel alloy substrates that are frequently used for depositing YBaCuO. This buffer layer must be both dense and thin. It must be dense in order to constitute an effective barrier for the diffusion of the nickel and oxygen. It must be thin to allow twisting without fracture when the cable is formed. It must replicate as faithfully as possible the crystalline structure of the surface of the substrate (see the article "*In situ strain and transport magneto-optical investigations in superconductors*" by A. Villaume et al, appearing in the journal Superconductor Science and Technology 21 (2008) 034009). For example, thin layers of mixed lanthanum-zirconium oxide $La_2Zr_2O_7$ are used (see for example the U.S. Pat. No. 6,451,450 (UT-Battelle)), the patent application WO 2008/078852 (Korea Institute of Machinery & Materials), the U.S. Pat. No. 6,537,689 and U.S. Pat. No. 7,261,776 (American Superconductor Corp) and the patent application US 2008/0113869 (V. Selvamanickam). This compound can also be deposited non-stoechiometrically (see patent application US 2008/0039330 (Wolf et al)). It is also possible to use oxides of other rare earths (samarium, gadolinium, dysprosium, erbium and ytterbium), to which yttrium and scandium can be added, or several layers with different compositions (for example $La_2Zr_2O_7/CeO_2$, see US 2007/01977045 (Trithor GmbH) and US 2007/0026247 (UT-Batelle, LLC).

The publication entitled "$La_2Zr_2O_7$ single buffer layer for YBaCuO RABiTS coated conductors" (Caroff et al, Supercond. Sci. Technol. 21 (2008) 075007) describes the preparation by MOD of buffer layers of $La_2Zr_2O_7$ (LZO) of high quality on metal substrates (Ni-5 at. % W alloys) bitextured by the RABiTS process and the subsequent deposition of YBaCuO layers (450 to 800 nm thick) by pulsed injection MOCVD, leading to a simple and inexpensive architecture $NiW_{RABiTS}/LZO_{MOD}/YBaCo_{MOCVD}$. In this novel combination of the MOD and MOCVD methods, a single $LZO_{MOD}$ buffer layer is sufficient to ensure structural compatibility between YBaCuO and NiW, and to protect the substrate from oxidation during the MOCVD deposition of YBaCuO. The YBaCuO films grow epitaxially on the LZO and have critical current densities $J_c$ close to 1 MA·cm$^{-2}$ at 77 K with a critical temperature $T_c$ of 91 k and a $\Delta T_c<1$ K.

The article "*Growth of thick chemical solution derived pyrochlore $La_2Zr_2O_7$ buffer layers for $YBa_2Cu_3O_{7-x}$ coated conductors*" by K. Knoth et al. (appearing in 2008 in the journal Thin Solid Films, p. 2009-2108) describes the deposition of LZO layers from solutions of Zr and La salts in propionic acid on strips of nickel containing 5 at. % tungsten; the thickness of these layers is between 80 nm and 200 nm.

However, all these works concern only flat substrates. It is not very easy to introduce flat conductors into cables with a generally circular cross section. It would be desirable to deposit round conductors in the form of wires in order to be able to manufacture electrically conductive cables, superconducting at the temperature of liquid nitrogen, enabling high current densities to pass, sufficiently flexible and robust for applications in an industrial environment, and sufficiently simple to manufacture in order to be economically viable.

The article "*YBaCuO Thick Films on Planar and Curved Technical Substrates*" by H. C. Freyhardt et al, appearing in 1997 in the journal IEEE Transactions on Applied Superconductivity, vol 7 n° 2, p. 1426-1431, describes the deposition by cathodic sputtering of layers of the YSZ (yttria-stabilized zirconium) type on flat and cylindrical surfaces; the surface thereof was polished mechanically or electrochemically.

The patent application EP 1 916 720 (Nexans) describes a method for manufacturing tubes made from biaxially textured metal, in which a flat strip (also referred to as a flat band) is formed around a metal core disposed in its long axis in a split tube, the two parallel edges then being welded one against the other over the entire length thereof by a weld of the MIG or TIG or laser type. This tube is then stretched in order to reduce its diameter until the core is in contact with the entire internal wall of the tube. Next a layer of YBaCuO is deposited to a thickness of between 1 μm and 5 μm from a gaseous or liquid phase followed by heat treatment. A layer with a thickness of 100 nm to 200 nm of cerium oxide or lanthanum-zirconium oxide can be deposited before the deposition of YBaCuO, using the same techniques as those employed for the deposition of YBaCuO. However, this document contains no concrete example for the manufacture of such a product, and does not mention the performances of such devices.

The patent application US 2008/0119365 of Arnaud Allais and Nat Dirk describes a method of manufacturing a superconducting electrical conductor with a circular cross section. The method consists of providing a metal support such as a wire, cord or tube with a diameter of between 0.5 and 3 mm, preferably made from steel. A metal layer is then deposited on the metal support, this layer having a thickness of between 1 and 20 nm. The deposition is carried out by PVD, CVD or CSD (chemical solution deposition). The film thus deposited is then subjected to texturing treatment so that as far as possible all the crystal grains are aligned (the method used for the texturing is not specified). A buffer layer of $La_2Zr_2O_7$ is then optionally deposited, by dipping in a propionic acid solution in which lanthanum acetylacetonate and zirconium acetylacetonate are dissolved. The liquid deposited dries and the material is subjected to heat treatment at 1000° C. (the duration of the treatment is not specified) in order to obtain an epitaxied layer of $La_2Zr_2O_7$, on which a layer of YBaCuO is then deposited by epitaxy.

The problem that the present invention aims to solve is to provide a method of manufacturing a long superconducting device, with a substantially circular cross section, in which the superconducting material is a ceramic of the YBaCuO type, deposited on the external surface of a metal tube or wire or cylinder and said method including the deposition of a buffer layer of oxide on the external surface of the metal tube or wire or cylinder prior to the deposition of the layer of YBaCuO.

SUBJECT MATTER OF THE INVENTION

A first subject matter of the invention is a method of depositing a buffer layer of epitaxial metal oxide on a functionalised surface of a textured metal substrate, and preferably a long metal substrate with a substantially circular or elliptical cross section, with a cubic texture having grains the direction [001] of which is perpendicular to the long direction of the substrate and the direction [100] of which is parallel to the long direction of the substrate, said method comprising the following steps:

(1) a layer is deposited of a precursor of an oxide of the type $(A)_{2-x}B_{2+x}O_7$ where A represents a metal of valency 3 (such as La, Y, Gd, Dy, Lu, Sc, Nd, Sa; La being preferred), or a mixture of several of these metals, and B a metal of valency 4 (such as Zr, Ti, Sn, Hf, Pb, Ce; Zr being preferred), such as $La_2Zr_2O_7$ (also referred to as LZO), and x is a number between −0.1 and +0.1, from a solution of carboxylates (and preferentially propionates) of said metals A and B, this solution preferably having a viscosity, measured at the temperature of the method, of between 1 mPa s and 20 mPa s, and ever more preferentially between 2 mPa s and 10 mPa s, (2) said layer of oxide precursor is left to dry, preferably at a temperature of between 60° and 150° C., preferably between 80° C. and 100° C., (3) heat treatment is carried out in order to pyrolyse said oxide precursor and to form the oxide, at least part of said heat treatment being carried out under a flow of reducing gas, preferably Ar+5% (vol) $H_2$, said reducing gas preferably having a flow rate greater than 0.005 cm/s, preferentially between 0.012 cm/s and 0.1 cm/s, and even more preferentially between 0.04 cm/s and 0.08 cm/s.

Advantageously, the heat treatment (step (3)) comprises a so-called pyrolysis phase and a so-called crystallisation phase. The pyrolysis phase involves a heat treatment between 150° C. and approximately 450° C. (which preferably does not exceed 350° C.), which can be carried out at least partly under reduced pressure. The crystallisation phase involves a heat treatment between approximately 450° C. and approximately 1100° C., preferentially between 800° C. and 1100° C., and preferentially between 850° C. and 1000° C., to form the oxide. The crystallisation phase is carried out under reducing-gas flow, as indicated above.

Advantageously, the heat treatment comprises a temperature rise rate of between 100° C./h and 2000° C./h, preferentially between 250° C./h and 2000° C./h and even more preferentially between 500° C./h and 2000° C./h, followed by a level phase at the temperature T for a period of between 1 and 120 minutes, preferentially between 10 and 90 minutes, and even more preferentially between 20 and 60 minutes, and followed by a cooling at a rate of between 100° C./h and 2000° C./h, preferentially between 100° C./h and 1000° C./h, and even more preferentially between 100° C./h and 500° C./h.

A second subject matter of the invention is the use of this method in a method of manufacturing superconductor devices comprising a superconducting layer of mixed rare-earth-barium-copper oxide (REBaCuO) or mixed yttrium-barium-copper oxide (YBaCuO or YBCO), said superconducting layer being deposited on said buffer layer.

A third subject matter of the invention is a method of manufacturing a superconducting electrical conductor with a substantially circular or elliptical cross section, said conductor comprising a layer of mixed rare-earth-barium-copper oxide (REBaCuO) or mixed yttrium-barium-copper oxide (YBaCuO or YBCO) as a superconductor material deposited on a metal substrate with a substantially circular cross section, said method comprising, in the order indicated, the following steps:

(a) a long metal substrate is provided, with a substantially circular or elliptical cross section, and typically a tubular substrate, said substrate having a cubic texture having grains the direction [001] of which is perpendicular to the cylindrical axis of the substrate;

(b) a functionalisation treatment at least of the external surface of said metal substrate is carried out, preferably by an $H_2S$ treatment;

(c) a buffer layer of epitaxial metal oxide is deposited at least on the functionalised external surface of said tube using a liquid solution, utilising the method that corresponds to the first subject matter of the present invention;

(d) the layer of REBaCuO or YBaCuO is deposited on the metal oxide layer deposited at step (c);

(e) a metal protective layer is deposited, preferably silver;

(f) an oxidising treatment is carried out.

A last subject matter of the invention is a superconducting electrical conductor with a substantially circular or elliptical transverse section able to be obtained by the aforementioned method.

DESCRIPTION OF THE FIGURES

FIG. 1 shows microscopic images of the surface of a substrate coated with a buffer layer of LZO according to the invention. The length of the bar represents 10 µm.

FIG. 2 shows a diagram of a textured tube according to the invention. The texture axes are indicated: the axis parallel to the long direction of the tube, and an axis radial to the tube (i.e. perpendicular to the long direction of the tube).

FIG. 3 shows a curve of the electrical resistance as a function of the temperature for a product manufactured according to the method of the invention. The horizontal axis is graduated in Kelvin, the vertical axis in Ohms.

FIG. 4 shows a differential-suction tube used for heat treatment of the layer deposited according to one embodiment of the invention.

The following references are used in this figure: 1—external space; 2—internal space; 3—perforated wall; 4—suction direction; 5—gas inlet direction; 6—product to be treated.

The arrows indicate a direction of flow of gas.

Figure 5:

FIG. 5 shows the form of a curved substrate, biaxially textured. This substrate has a "crinkled" or "ribbed" form.

DESCRIPTION OF THE INVENTION

The present invention shows a method of manufacturing a superconducting electrical conductor comprising a layer of ceramic of the type $(RE)Ba_2Cu_3O_{7-x}$ (where RE represents one or more rare-earth elements; this compound here being called, independently of its stoechiometry, "REBaCuO"), or of the type $YBa_2Cu_3O_{7-x}$ (here called, independently of its stoechiometry, "YBaCuO"), of the type $Bi_2Sr_2Ca_2Cu_3O_{10+y}$, of the type $Tl_2Ba_2Cu_2Cu_3O_{10+y}$, or of the type $HgBa_2Ca_2Cu_3O_{8-y}$, as a superconductor material deposited on a textured metal substrate. It concerns in particular a method of manufacturing a superconducting electrical conductor comprising a layer of mixed yttrium-barium-copper oxide (YBaCuO or YBCO, this designation being independent of the stoechiometry of the formula).

In a particularly advantageous embodiment of the invention, the method comprises, in the order indicated, the following steps:

(i) a long metal substrate is provided, with a substantially circular or elliptical cross section, and typically a tubular substrate, said substrate having a cubic texture having grains the direction [001] of which is perpendicular to the cylindrical axis of the substrate, and the direction [100] of which is parallel to the long direction of the substrate;

(ii) a functionalisation treatment at least of the external surface of said metal substrate is carried out, preferably by an $H_2S$ treatment;

(iii) a buffer layer of epitaxial metal oxide is deposited at least on the functionalised external surface of the tube using a liquid solution;

(iv) a layer of REBaCuO or YBaCuO is deposited on the metal oxide layer deposited at step (iii);

(v) a metal protective layer is deposited, preferably silver;

(vi) an oxidising treatment is carried out;

said method being characterised in that:

at step (iii)

(a) a layer of a precursor of an oxide of the type $A_{2-x}B_{2+x}O_7$ is deposited, where A represents a metal of valency 3 (such as La, Y Gd, Dy, Lu, Sc, Nd, Sa; La being preferred) or a mixture of several of these metals, and B a metal of valency 4 (such as Zr, Ti, Sn, Hf, Pb, Ce; Zr being preferred), such as $La_2Zr_2O_7$ (also referred to as LZO), and x is a number between −0.1 and +0.1, using a solution of propionates (carboxylates) of said metals A and B, this solution preferably having a viscosity, measured at the temperature of the method, lying between 1 mPa s and 20 mPa s, and even more preferentially between 2 mPa s and 10 mPa s, (b) said precursor layer is left to dry, preferably at a temperature of between 80° C. and 100° C., (c) a heat treatment is carried out at a temperature T of between 800° C. and 1100° C., and preferentially between 850° C. and 1000° C., to form the oxide, this treatment being carried out:

with a temperature rise rate of between 100° C./h and 2000° C./h, preferentially between 250° C./h and 2000° C./h and even more preferentially between 500° C./h and 2000° C./h, followed by a level phase at the temperature T for a period of between 1 and 120 minutes, preferentially between 10 and 90 minutes, and even more preferentially between 20 and 60 minutes, and followed by a cooling at a rate of between 100° C./h and 2000° C./h, preferentially between 100° C./h and 1000° C./h, and even more preferentially between 100° C./h and 500° C./h;

under a flow of reducing gas, preferably Ar+5% (vol) $H_2$, said reducing gas preferably having a flow rate greater than 0.005 cm/s, preferentially between 0.012 cm/s and 0.1 cm/s, and even more preferentially between 0.04 cm/s and 0.08 cm/s.

According to the invention, at step (ii):

advantageously a functionalisation treatment of the metal substrate is carried out by a method comprising the steps of:

treatment under vacuum (a vacuum of approximately $10^{-3}$ bar is suitable) with a temperature rise rate of 800° C./h, with a level phase at 600° C. for a period of at least one minute and preferably between 10 and 60 minutes (advantageously for approximately 30 minutes), followed by cooling to ambient temperature, functionalisation treatment, preferably by inert gas flow (Ar) with 0.1% (vol) $H_2S$ at ambient temperature and at a pressure of between $10^{-3}$ bar and 10 bar, preferentially at atmospheric pressure, for a period of at least 1 minute, and advantageously approximately 30 minutes, treatment under inert gas flow Ar+5% (vol) $H_2$ with a temperature rise rate of 800° C./h, with a level phase at 850° C. for 30 minutes, followed by cooling to ambient temperature.

We describe here in detail each of the steps.

(i) Providing a Metal Substrate

The method according to the invention can apply to flat or curved textured metal substrates, and in particular to substrates with a substantially circular or elliptical cross section. These substrates may be tubular. They must be made from metal that crystallises in a structure of the FCC (face-centred cubic) type. They may be made from nickel or nickel alloy with tungsten, and must have a {100}<100> cubic texture. Tubular substrates that are suitable for implementing the invention can be fabricated by a method of welding the edges in which a flat strip (also referred to as a flat band) is formed around a metal core arranged in its long axis as a split tube, the two parallel edges then being welded one against the other over their entire length by a weld of the MIG or TIG type. Laser welding is also possible; it gives rise to no risk of contamination if it proceeds without the addition of metal. This tube is then drawn in order to reduce its diameter until the core is in contact with the entire internal wall of the tube. Other methods may be suitable for obtaining these textured substrates with a substantially circular or elliptical cross section.

On these biaxially textured metal substrates, preferably with a substantially circular or elliptical transverse section, and in particular on tubes, there are carried out successively treatments of functionalisation of the metal substrate, chemical deposition of a precursor of the buffer layer and heat treatment, with a view to obtaining a layer consisting of a film of oxide, as dense as possible and hypertextured. For this purpose epitaxial growth on the grains of the substrate is used. The starting point is a wetting metal-organic precursor that makes it possible to perform the deposition, which is dried and then heat treated in order to synthesise the oxide.

Prior to the functionalisation of the substrate with a view to the depositing of the oxide layer, the metal substrate must be degreased. Advantageously, this is done in two steps: first of all by means of acetone (preferably in a bath subjected to ultrasound) and then by means of an alcohol, such as methanol, ethanol, butanols or hexanols (methanol being preferred since evaporation thereof leaves no trace).

(ii) Functionalisation of the Substrate

Prior to the deposition of the metal-organic precursor of the LZO buffer layer, the substrate must have been functionalised. Functionalisation of the metal substrate has two objectives: a first objective is to provide an adaptation layer enabling the oxide to be bonded to the metal: it is a case of creating crystallographic sites on the metal able to bond to those of the oxide. In this way a layer is obtained that reproduces the atomic structure of the substrate (i.e. epitaxy).

Another purpose of functionalisation is to create a chemically stable surface since this surface will necessarily be exposed to ambient pressure when the substrate is dipped in a solution to deposit the buffer layer.

This step is essential to enable the atoms of the oxide to be chemically bonded to those of the metal.

In practice, functionalisation of the substrate is preferably carried out by a surface treatment, consisting of a deposition of one or more monolayers of sulphur. It is known that sulphur forms an ordered chemisorbed layer on the FCC (face-centred cubic) crystallographic-structure metals generally used as substrates. This layer of sulphur can be obtained by suitable heat treatment, and advantageously by a method comprising the steps of:

treatment under vacuum (a primary vacuum, i.e. around $10^{-3}$ bar, suffices) with a temperature rise rate of between 600° C./h and 1000° C./h (and preferably approximately 800° C./h), followed by a level phase at a temperature of between 550° C. and 650° C. (preferably approximately 600° C.) for approximately 30 minutes, and then cooling to ambient temperature, flowing with inert gas (Ar) with approximately 0.1% (vol) $H_2S$ at ambient temperature for approximately 30 minutes, at atmospheric pressure;

treatment under reducing-gas flow, preferably Ar+5% (vol) $H_2$, with a temperature rise rate of between 600° C./h and 1000° C./h (and preferably approximately 800° C./h), optionally followed by a level phase at a temperature of between 750° C. and 900° C. (preferably approximately 850° C.) for approximately 30 minutes, and then cooling to ambient temperature.

This layer can be checked by surface analysis techniques known to persons skilled in the art for this use, such as Auger or RHEED.

The principle of sulphuration treatment is known: a monolayer of sulphur is deposited under ultravacuum, as suggested in the article "*RHEED Studies of Epitaxial Oxide Seed-Layer Growth on RABiTS Ni (001): The Role of Surface Structure and Chemistry*" by C Cantoni et al, (available on the internet server [cond-mat.supr.con], arXiv:cond-mat/0106254v1). This method has not been used, to the knowledge of the inventors, at atmospheric pressure or under primary vacuum for functionalising a cylindrical substrate intended to receive a layer of LZO deposited by liquid method.

A method of depositing sulphur on the substrate before deposition of the YBaCuO layer at atmospheric pressure is also described in the patent applications of the company American Superconductor Corp., US 2007/0197395 (but in this document a metal or oxide buffer layer other LZO is deposited on top of this sulphur layer, before deposition of the YBaCuO layer) and US 2007/0179063.

Alternatively, it is possible to use, for the functionalisation treatment, a sulphur compound, such as an organic sulphide; however, carbon may interfere with the surface functionalisation. It is also possible to treat the surface with sulphur vapours, but this is difficult to measure out. Because of the availability and simplicity of the $H_2S$ molecule, this treatment is preferred.

The surface can also be functionalised by creating a monolayer of oxygen.

The result of the functionalisation process is a functionalisation layer stable in air for the period necessary for transferring the substrate in the liquid phase for epitaxy.

In the case where the metal substrate contains sulphur, it is possible to use the surface that forms by segregation following certain heat treatments of the metal, which then take the place of functionalisation treatment. Since segregation takes place during cooling, it is the cooling that must be carefully controlled. In some cases, texturising annealing may thus comprise functionalisation annealing.

(iii) Deposition of the Buffer Layer

Deposition of the buffer layer is an essential feature of the present invention. The layer is obtained by chemical deposition in solution followed by heat treatment. This buffer layer is essential since it is on this that the texture of the YBaCuO layer is duplicated which, if it is correct, will allow passage of high current densities of electric current. An optimum buffer layer firstly reproduces the texture of the substrate and secondly constitutes an effective barrier to diffusion. A layer constitutes an effect barrier to diffusion in particular if it is dense and has only low porosity formed by unconnected small holes.

The buffer layer deposited in the context of the present invention is an oxide of the $A_{2-x}B_{2-x}O_7$ type where A is a metal of valency 3 (such as La or an lanthanide, such as Gd, Dy, Lu, Nd, Sa or Sc; La being preferred) and B a metal of valency 4 (such as Zr, Ti, Sn, Hf, Pb, Ce, Ta; Zr being preferred) such as $La_2Zr_2O_7$ (also referred to as LZO), and x is a number between −0.1 and +0.1. It is very preferentially a mixed lanthanum and zirconium oxide of nominal composition $La_2Zr_2O_7$ (LZO). This is because it was shown recently (Caroff et al, Sup. Sci. Technol. 2008, 21 075007) that it was possible, on flat substrates, to have only a single buffer layer of LZO, which is very economical. It is possible to use oxides other than LZO, such as for example $SrTiO_3$, $LaMnO_3$ or YSZ, but then an architecture that is in general complex is needed since very few oxides manage to satisfy all the functions of the buffers at the same time. This is why layers of the type $A_{2-x}B_{2+x}O_7$ and more especially LZO are widely preferred. In particular, if a buffer layer composed of several layers is envisaged, the inventors prefer to use such an LZO layer in contact with the metal substrate. However, they prefer a homogeneous layer, applied at one go.

In the formula $A_{2-x}B_{2+x}O_7$, A can also represent several metal elements of valency 3, and B can represent several metal elements of valency 4. By way of example, in a layer of the LZO type, the La atoms can at least partially be replaced by Gd atoms. It is also possible to deposit, on top of a first thin layer of LZO, a second layer of GZO (gadolinium-zirconium-oxide).

The inventors have shown that a good quality of buffer layer (and in particular a layer of LZO deposited as described below) enormously simplifies the architecture of the superconductors deposited. Thus the multilayer structure Ni5W/LZO/YBaCuO/protection (Ag) deposited on a flat substrate makes it possible to pass close on 1 $MA/cm^{-2}$ at 77° K whereas the solutions of the prior art propose up to 10 buffer layers in order to achieve the same result. The method according to the invention makes it possible in particular to use a single type of buffer layer and because of this it is simpler than the known methods. In particular, the method according to the invention makes it possible to deposit such a layer on a curved substrate, for example on a tube, so as subsequently to obtain a layer that is superconductive at the temperature of liquid nitrogen, which does not appear to be possible with the methods according to the prior art.

Obtaining an oxide layer of good quality according to the method of the invention involves many factors.

(1) Precursor

Decomposition of the precursor must give an oxide. In the present invention, use is preferably made of carboxylates in which the cation is coordinated with oxygens. It therefore enables oxides to be formed, even under reducing conditions preventing oxidation of the substrate metal. The advantage of carboxylates is the stability thereof vis-à-vis moisture in the atmosphere. The precursor is deposited by liquid method, and in particular by dipping. Among the carboxylates, propionates are preferred.

In order to obtain a layer of LZO, the precursor used in the present invention is a 0.6 mol/l solution of $LaZr(prop)_7$ (La/Zr=1:1, i.e. the solution contains 0.3 mol/l of La and 0.3 mol/l of Zr) in propionic acid. $LaZr(prop)_7$ is preferably prepared by attack in propionic acid of $La(acac)_3 \times 3H_2O$ and $Zr(acac)_4$ (where "acac" designates acetylacetonate) separately, while lightly heating (typically at approximately 60° C.), without evaporating a significant quantity of propionic acid. The maximum concentration of $LaZr(prop)_7$ usable appears to be 0.9 mol/l.

In order to obtain other layers of the $A_{2-x}B_{2+x}O_7$ type, use is advantageously also made of carboxylates, and even more preferably propionates of A and B metals. By way of example, in order to introduce gadolinium into a composition in order to deposit a layer of $Gd_2Zr_2O_7$ (GZO), use is advantageously made of gadolinium propionate.

(2) Viscosity

The viscosity η of the solution is a very important parameter since it determines the thickness deposited after dipping.

The viscosity of metal propionate solutions, and in particular that of LZO propionate solutions ($LaZr(prop)_7$), in propionic acid, depends on the concentration of the solution. It is known (see for example Knoth et al, Sup. Sci. Technol. 18 (2005), p. 334-339) that the viscosity of a 0.05 mol/l solution is equal to 1.5 mPa s, 2.5 for 0.15 mol/l, and 6.5 mPa s for a concentration of 0.3 mol/l. The thickness deposited after dipping d is given by the Landau-Levich equation:

$$d = a \frac{(\eta v)^{2/2}}{\gamma^{1/6}([\rho g])^{1/2}}$$

where γ is the liquid-vapour surface tension, ρ the density of the liquid and v the speed of removal from the bath, and a is a numerical parameter that is equal to approximately 0.94.

Adjuvants such as plurifunctionalised compounds, selected for example from polyamines, polyamides, polyethers, amino alcohols or true polymers, such as for example polymethyl methacrylate (PMMA), polyethylene glycol (PEG) or polyvinyl alcohol (PVA), can be added to the propionate solution in order to thicken the solution and increase the thickness deposited.

Moreover, the thickness of the deposit of precursor also depends on the temperature of the bath. Raising the temperature by a few degrees may modify the final thickness of oxide obtained after heat treatment by several tens of %. It is preferred not to exceed 40° C., and even more preferentially not to exceed 30° C. Above 40° C., the composition of the solution changes due to the evaporation of the solvent (typically propionic acid if propionates are used). An excessively low temperature of the bath is liable to lead to an onset of crystallisation of one of the species present in the bath. Consequently a temperature of between 20° C. and 30° C. is preferred. The viscosity of the precursor solution at the temperature of the method is preferentially between 1 mPa s and 20 mPa s, and even more preferentially between 2 mPa s and 10 mPa s. This measurement is carried out in a conventional manner by means of a ball viscometer.

The method according to the invention involves a substrate cylindrical in shape, such as a tube. Deposition takes place by dipping. When the substrate is removed from the liquid, the latter drains off but a film remains deposited, the thickness of which is governed by the law written above. The cylindrical geometry of the substrate modifies the flows with respect to plane geometry, in particular because of edge effects that are different.

(3) Drying

Drying makes it possible to obtain a solid layer that has the appearance of a polymeric resin. It makes it possible to handle the object easily. To obtain this layer, the layer of precursor deposited by liquid method is dried, preferably at a temperature of between 80° C. and 100° C., advantageously by infrared heating. This drying leads to the at least partial polymerisation of the layer, attested to by the fact that the precursor becomes rigid and only partially soluble in the usual solvents. This layer can also be dried by a flow of hot neutral gas (argon or nitrogen for example), preferably at a temperature of between 80° C. and 100° C.

The dipping and drying/polymerisation steps are carried out in a controlled atmosphere. This involves firstly protection against dust that would make "flaws" in the film. This also involves careful control of the humidity level, so that the method is reproducible. A relative humidity level of 20% is suitable. A lower level may also be suitable.

(4) Thickness Deposited

The thickness deposited depends on the extraction rate, the viscosity and the liquid-vapour surface tension. The extraction rate, that is to say the rate at which the substrate is extracted from the liquid, is advantageously between 1 mm/min and 100 mm/min, and is preferably at least 10 mm/min. In general the optimum thickness range of LZO, having regard to the properties of the superconductor that subsequently covers it, is situated between 30 nm and 250 nm. The inventors were able to deposit on curved surfaces, and in particular on tubes with a diameter of a few millimeters, up to 250 nm of LZO, in several successive deposits, without cracks and with correct texture qualities, although these layers are not always crystallized on the surface as required. Provided that there are correct texture and crystallization qualities, it is preferable to have a buffer layer not only the density of which but also the thickness of which is high, within the limits indicated above. This is because the inventors have found that the properties of the REBaCuO or YBaCuO superconductive layer are better for the highest thicknesses of LZO. One explanation could be that the surface defects of the substrate are more masked with thick buffer layers. A thickness of between 60 nm and 250 nm is preferred, and even more preferentially between 80 nm and 250 nm. This is because the method according to the invention makes it possible to deposit a thickness of between 30 nm and approximately 120 nm in one go, without the formation of cracks. A typical thickness deposited in one go is 80 nm. Depositing several layers one on the other, these layers having identical compositions, gives a better densification of the buffer layer obtained. The layer deposited in a single deposition or in several successive depositions is textured biaxially.

The method according to the invention differs from methods on a flat substrate through the texture of the substrate. In flat strips, the texture is three-dimensional and has two preferential orthogonal directions. This means that the grains are oriented with respect to one another in the plane and perpendicular to the plane. If this strip is rolled in order to make a tube from it, radial disorientations between grains will be introduced mechanically and surface stresses created. The mean radial disorientation between grains can be calculated if the number of grains over 360° is known. A substrate in the form of a tube, as used in the context of the present invention, typically has a mean grain size of 50 μm, observed over a zone with a diameter of 2 mm, which leads to a mean radial disorientation between grains of approximately 3°; this is acceptable. Such a substrate has a bidirectional texture with a radial axis and an axial axis. Its oxide layer typically has a grain size of between 50 nm and 80 nm.

(5) Heat Treatment

This step is particularly critical for the method according to the invention. After drying the film is raised to a temperature of between 850° C. and 1100° C. with a temperature rise rate of between 100° C. and 2000° C./h under a flow of reducing gas, preferably a mixture of argon containing 5 vol % $H_2$. The use of such a gas prevents oxidation of the substrate. It may be useful to implement a level phase at high temperature.

The gas flow and flow rate, the temperature rise rate and the treatment temperature (maximum temperature) are essential parameters of the phase of the heat treatment. The gas speed must be as high as possible, without risking cooling the sample, and influences how the pyrolysis of the precursors takes place, in particular the advancement of the pyrolysis front, and the advancement of the crystallisation front of the textured part in the film.

The heat treatment temperature is advantageously between 800° C. and 1100° C. in order to form the oxide. It must be above 850° C., in order to initiate crystallisation, and must be less than the crystallisation temperature of the substrate otherwise it will lose its texture. The optimum temperature depends on the substrate. For Ni-5 at. % W substrates, the recrystallisation temperature is advantageously situated around 1100° C. An excessively high temperature, and an excessively long treatment at high temperature, may promote interdiffusion between the metal substrate and the buffer layer. In particular, the tungsten of the nickel-tungsten substrate may diffuse in the buffer layer, and the lanthanum of the buffer layer may diffuse in the metal substrate. There may also be reactions at the interface. The optimum crystallisation temperature depends slightly on the metal element composition of the layer. The values given above are optimum for LZO. A doping with Gd may prompt this temperature to be reduced slightly.

In any event, the heat treatment advantageously takes place with a temperature rise rate of between 100° C./h and 2000° C./h, preferentially between 250° C./h and 2000° C./h and even more preferentially between 500° C./h and 2000° C./h, followed by a level phase at the temperature T for a period of between 1 and 120 minutes, preferentially between 10 and 90 minutes, and even more preferentially between 20 and 60 minutes, and followed by cooling at a rate of between 100° C./h and 2000° C./h, preferentially between 100° C./h and 1000° C./h and even more preferentially between 100° C./h and 500° C./h.

In a particular embodiment, the heat treatment can be carried out in two parts or phases distinguished by their temperature range: a first part or so-called pyrolysis phase, ranging from approximately 150° C. to approximately 350° C., and a second so-called crystallisation part or phase, ranging from approximately 450° C. to approximately 1000° C. or 1100° C. The temperature rise rates within these two ranges may be different, for example slow in pyrolysis phase and fast in crystallisation phase.

Advantageously, the heat treatment involves a passage under vacuum in the pyrolysis domain. At the end of the pyrolysis phase, it can be left to cool to ambient temperature, or the heat treatment can be contained by increasing the temperature to arrive in the crystallisation phase.

Moreover, the heat treatment during the crystallisation phase must take place under a flow of reducing gas, preferably Ar+5% (vol) $H_2$, said reducing gas preferably having a flow rate greater than 0.005 cm/s, preferentially between 0.012 cm/s and 0.1 cm/s, and even more preferentially between 0.04 cm/s and 0.08 cm/s. It is also possible to use a mixture of $N_2+H_2$ (typically 5% vol. $H_2$) which is less expensive than an Ar+$H_2$ mixture.

Figure 4:
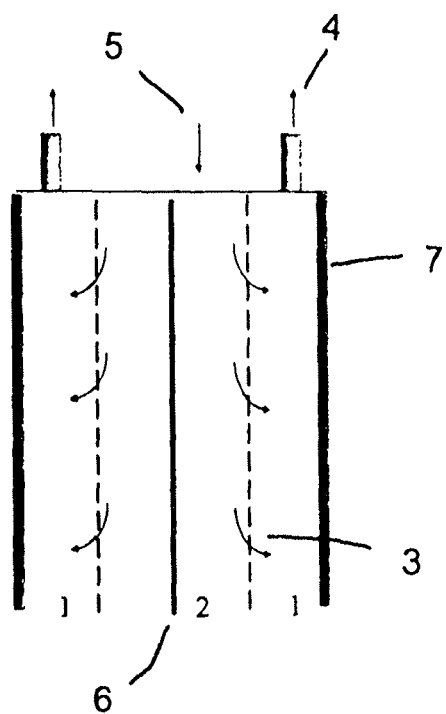

In an advantageous embodiment of the invention, this gas flow is obtained by injecting the preheated gas in counter-flow in a so-called differential aspiration tube, which is shown schematically in FIG. 4. It comprises a heated wall (7) and perforated internal walls (3) that delimit an internal space (2) and an external space (1). The product to be treated (6) is situated in the internal space (2). The gas enters (4) the tube, entrains the gaseous products from the pyrolysis reaction and is extracted outside the tube by suction (4) through the perforated walls (3). The pressure in the internal space (2) is greater than that in the external space (1).

The gas flow can also be applied during the pyrolysis phase, if it is not chosen to perform the pyrolysis as indicated above under vacuum.

In a typical embodiment, the pyrolysis phase is carried out at 350° C. under primary vacuum for 1 hour (minimum 30 minutes) in order to eliminate the propionic acid residues, and the crystallisation phase is carried out under argon/$H_2$ flow as described above.

The growth of the epitaxiated part that starts at the interface by heterogeneous nucleation on the substrate must extend as far as the surface in order to allow resumption of epitaxy for the subsequent deposition of a REBaCuO or YBaCuO layer of good quality. However, the properties of the oxide buffer films obtained by chemical method mean that nucleation may also occur in the non-epitaxiated part by homogeneous-phase nucleation, the grains then germinating in random directions. It is essential to avoid this homogenous-phase nucleation so that the film is textured throughout its thickness, as far as the surface.

Without wishing to be trapped in this scientific hypothesis, the inventors think that the carbon and carbonaceous species, and possibly also the oxygen and carbonaceous compounds that comprise it, generated by the pyrolysis of the metalorganic precursor, fulfil an important role in this process and possibly block the nucleation and homogeneous growth, thus enabling the textured part easily to extend as far as the surface.

Likewise, the inventors imagine that the flow of the conditioning gas passing over the film during the heat treatment thereof acts on the kinetics of the pyrolysis of the precursors and manages the advance of the growth front of the textured part. This hypothesis would make it possible to explain why the annealing rate fulfils an important role in the pyrolysis, nucleation and crystallisation, and therefore partly determines the microstructure of the ceramic film constituting the layer of oxide.

Surprisingly, the inventors have found that, in the method according to the invention, nucleation takes place by epitaxy on the grains of the metal substrate, leading to an epitaxial layer of excellent quality, that is to say crystallised, textured on the surface and dense, which then makes it possible to deposit REBaCuO or YBaCuO layers of very good quality. The obtaining by this method of a curved epitaxial layer that is textured on the surface is surprising since any disorientation of the grains of the substrate may have repercussions on the grains that have nucleated. This is one of the problems specific to non-plane geometry; the method according to the invention solves this problem. The fact that the layer of oxide, for example the LZO layer, is textured on the surface enables the REBaCuO or YBaCuO layers, to resume this texture when it is deposited by epitaxy; in this way a REBaCuO or YBaCuO layer is obtained with a controlled structure that has excellent superconducting properties. It is therefore on non-plane (i.e. curved) substrates that the method according to the invention is particularly advantageous compared with the known methods.

(iv) Deposition of the Layer of REBaCuO

The substrate covered with its buffer layer is then covered with a superconducting layer of REBaCuO or YBaCuO and finally with a fine protective layer by sputtering of Ag. This superconducting layer is advantageously a layer of YBaCuO. In one embodiment, its thickness is between 200 nm and 500 nm.

The REBaCuO or YBaCuO layer is preferably deposited by the MOCVD (metal-organic chemical vapour deposition) technique, which persons skilled in the art know as such. A technique of deposition of YBaCuO by MOCVD that is suitable is described for example in the patent application WO 93/08838 and in the article published by Donet et al in J. Phys IV Pr 11 AA 319 in 2001.

It is possible to advantageously use an MOCVD technique with periodic injection of droplets as described in the aforementioned documents WO 95/02711 and U.S. Pat. No. 5,945,162, which makes it possible to synthesise thin layers of complex materials of the REBaCuO type with very good control of the stoechiometry, the growth rate and the crystal-line quality of the films. The principle thereof is based on the use of an electronic-control microvalve that makes it possible to introduce very precisely controlled liquid volumes of a solution composed of organometallic precursors and a solvent. The solution is contained in a pressurised flask under inert atmosphere and connected to the injector. Microdroplets are injected sequentially into an evaporator (at a temperature of approximately 250° C.), where the solvent and precursors are vaporised. A gaseous flow transports the precursors into the reaction area, where the CVD growth takes place on a heated substrate. In this way it is possible to inject either droplets consisting of mixtures of several precursors, or successively droplets consisting of a single precursor. This technique enables layers with a complex chemical composition to be deposited.

In order to deposit evenly on a cylindrically-shaped substrate, it is possible to use for example several rows of nozzles distributed around the cylinder, or the cylindrical substrate can be turned about its long axis in front of plurality of nozzles. Sixteen nozzles can for example be used distributed over a length of 30 cm.

(v) Deposition of a Metal Layer

On top of the REBaCuO or YBaCuO layer, a metal layer is then deposited. This layer is preferably permeable to oxygen, enabling it to be diffused. Silver gives the best result. This layer can be deposited with any known technique but preference is given to deposition under conditions affording an absence of interface contaminants preventing the transfer of current between the protective layer of silver and the superconductive layer. The interface can for example be cleaned by an argon-oxygen plasma.

In one embodiment, a layer of silver with a thickness of between 250 nm and 450 nm is deposited.

(vi) Oxidising Treatment

Oxidising treatment is necessary since, under the conditions of the MOCVD deposition, the YBaCO compound has an oxygen stoechiometry of less than 6.93, conferring on it a quadratic structure at high temperature, which transits to an orthorhombic structure at 500° C. Nevertheless, in order to approach the ideal stoechiometry of 6.93, the cooling must take place at an atmospheric pressure of oxygen. In an inline process this step is carried out separately by virtue of post-deposition treatment at a temperature of between 450° C. and 600° C., preferably between 500° C. and 600° C., under pure oxygen, for several hours, followed by a slow descent at a few hundreds of degrees per hour, typically 100° C./h. Silver, because of its permeability to oxygen and its inert character vis-à-vis oxygen, makes oxidising treatment possible after the metallisation step.

We describe here two variants of the method according to the invention.

In a first variant, a flat metal substrate is provided, previously textured biaxially, which is coated with a buffer layer of epitaxial metal oxide, using a method of the prior art or the method according to the invention. This flat substrate is next converted into a long substrate with a substantially circular or elliptical cross section, and typically a tubular substrate, preferably by the edge welding method described above. During this rolling/welding process, the buffer layer is inevitably damaged, and it is necessary to redeposit a second buffer layer on top of the first, by the deposition method described above. It is preferred to deposit one or more layers of very thin epitaxial metal oxide, to a thickness of between 20 and 60 nm, and even more preferably approximately 40 nm. Next the method according to the invention is continued as described above with the deposition of the layer of REBaCuO or YBaCuO (step (iv)), the deposition of the protective metal layer (step (v)) and the oxidising treatment (step (vi)).

In a second variant, a highly work-hardened but non-textured flat substrate is provided, and is converted into a long metal substrate with a substantially circular or elliptical cross section, and typically a tubular substrate, preferably using the edge welding method described above. Next, a texturising annealing is carried out, and the method according to the invention is continued as described above, with a functionalisation treatment (step (ii)), followed by the deposition of the buffer layer (step (iii)), the deposition of the layer of REBaCuO or YBaCuO (step (iv)), the deposition of the protective metal layer (step (v)) and the oxidising treatment (step (vi)).

The method according to the invention has numerous advantages. It allows the preparation of conductors that are superconducting at high temperature with a substantially circular or elliptical transverse cross section by a continuous process ("reel-to-reel") of successive deposition of layers of high crystallographic quality.

In a particular embodiment of the invention, a textured metal substrate is used that has grooves. It is possible for example to use a corrugated or ribbed substrate that has been prepared from a flat sheet by a mechanical deformation method, for example by the application of rollers. These grooves or ribs are advantageously disposed in a direction other than orthogonal to the long direction of the substrate; they do not need to be parallel to one another, or parallel to the long axis of the substrate. On such substrates, it is possible to deposit REBaCuO in the (hollow) spaces of the grooves, ribs or corrugations, which give rise to veins of superconducting material; in this way the alternating current losses are reduced by dividing the section where the current flows.

The method according to the invention is particularly well suited for depositing a homogeneous buffer layer of the $A_{2-x}B_{2+x}O_7$ type on such a grooved substrate (such as a corrugated or ribbed substrate), whereas the vacuum methods on such a substrate in general lead to layers having an uneven thickness.

EXAMPLES

These examples serve to illustrate embodiments of the invention, but do not limit it.

Example 1

Advantageous products according to the invention were produced, which have the following features:
  The buffer layer of metal oxide is a layer of LZO, which typically has a thickness of between 80 nm and 210 nm.
  The layer of REBaCuO or YBaCuO is advantageously a layer of YBaCuO having a thickness of between 200 nm and 500 nm, and typically around 350 nm.
  The metal protective layer is a layer of silver, which typically has a thickness of between 250 nm and 450 nm, and typically around 350 nm.

Such a thread of YBaCuO deposited on textured Ni thread has a temperature $T_c$ of at least 83 K, preferentially at least 85 K, and even more preferentially at least 93 K. The current density measured at 4 K is greater than 3 A per centimeter of perimeter.

Figure 1:
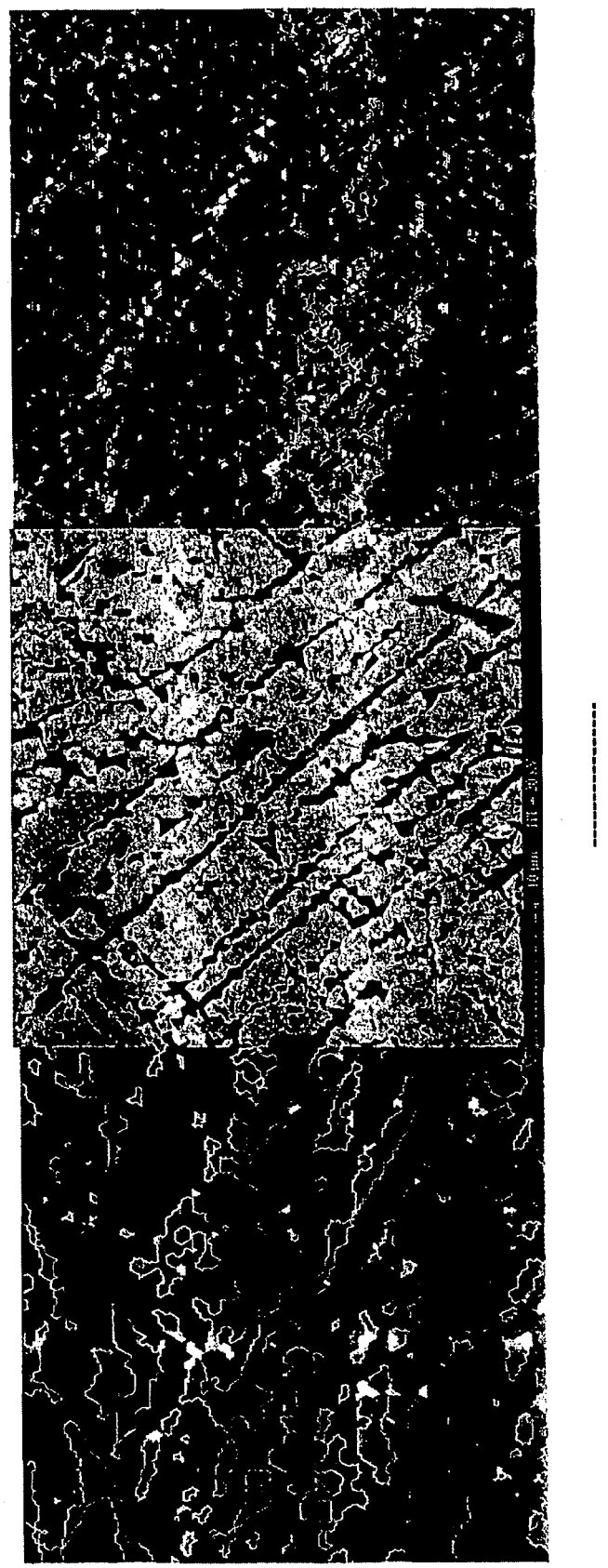
FIGS. 1 to 5 relate to the present invention.
Figure 2:
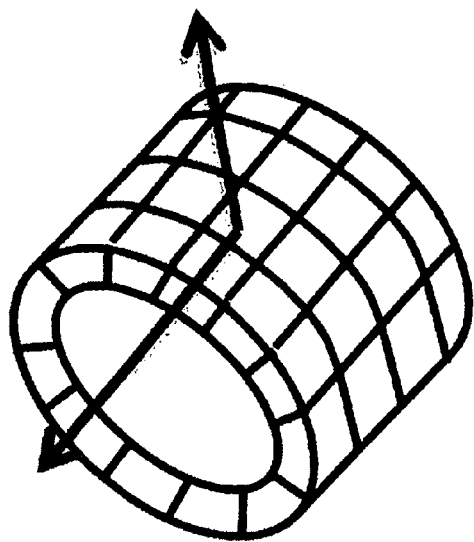

FIG. 1 shows three micrographs, obtained by different techniques, of the same tube coated with a layer of LZO deposited by the method according to the invention. In this example, the layer of LZO was deposited at a thickness of 110 nm on a biaxial textured Ni-5at. % W flat substrate, which was converted into a tube by a rolling/welding method.

FIG. 1(b) shows a micrograph obtained by scanning electron microscopy (acceleration voltage 20 kV) on a rolled/welded tube. During the drawing phase, the layer of LZO is fractured according to the Lüders bands generated by the deformation of the metal substrate. The micrograph shows the fractures of the LZO layer caused by this deformation.

FIG. 1(a) shows a micrograph obtained by scanning electron microscopy in Electron Backscattered Surface Diffraction (EBSD) mode of the same tube. This technique gives information on the relative orientations of the surface grains. The dark parts represent grains of $La_2Zr_2O_7$ with the axes [001] thereof parallel to the normal of the surface of the tube (axis r, see FIG. 4) and the axes [100] thereof parallel to the axis of the cylinder (Z). The light grey zones are turned through 45° with respect to the previous ones (direction <110>). These are areas of Ni-5 at. % W uncovered during the preparation of the tube, which appear dark on the micrograph in FIG. 1(b). They are turned through 45° with respect to the grains of $La_2Zr_2O_7$ for reasons of agreement of crystallographic mesh between these two compounds. The white regions correspond to completely disoriented grains.

FIG. 1(c) shows a micrograph obtained by scanning electron microscopy in Electron Backscattered Diffraction Mode under identical conditions to those used for FIG. 1(b), on a tube the LZO layer of which has been repaired by deposition of a second layer of LZO by the method according to the invention. It can be seen that this second deposit fills in the empty areas caused by the tube forming process, which are visible in FIGS. 1(a) and 1(b).

This example shows that the fractured LZO surface, damaged when an initially flat metal substrate is shaped, can be repaired by means of a second layer of LZO deposited according to the method of the invention.

Figure 3:
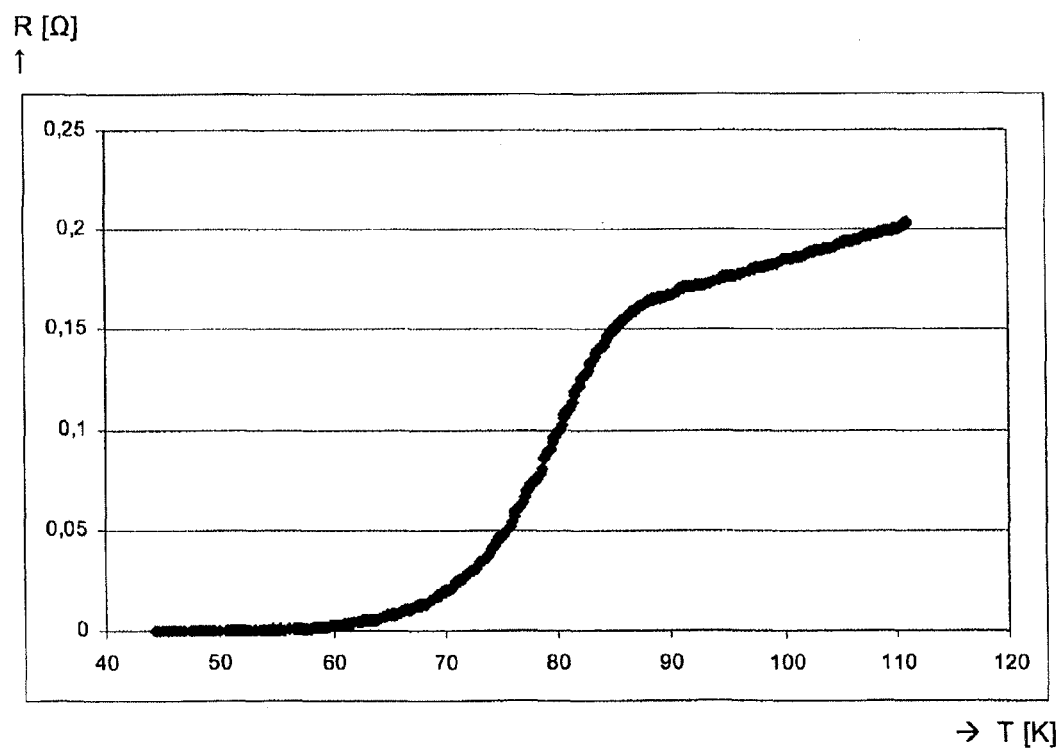

FIG. 3 shows that a deposit of YBaCuO on such a substrate can have a resistivity of less than 0.10Ω at 80 K, and a zero resistivity at around 60 K, where it becomes superconducting.

Example 2

This example describes the deposition of an epitaxiated thin layer of $La_2Zr_2O_7$ on a corrugated or ribbed sheet. The substrate was a biaxially textured Ni ribbed sheet, with a thickness of 80 μm, a length of 4 cm and a width of 1 cm; its form is shown schematically in FIG. 5. This sheet was obtained from a flat sheet by pressing on two alumina rods 1 mm in diameter, disposed parallel to the length of the sample and separated by approximately 7 mm. After pressing, the shape of the rods is encrusted in the sheet, giving a corrugated form having slightly angular projections. A significant increase in the thickness of the sheet is noted, facilitating manipulation thereof.

The sheet was then dipped in a solution of a propionate of a metal with a suitable viscosity, and then extracted at the rate of 66 mm/min in order to cover it with a uniform deposit. The thickness of this deposit is determined by the flow of the liquid downwards, the critical parameters being the viscosity and the surface tension. On the surface of the sheet, the concave parts serve as drains and the thickness of the layer is smaller in these parts, as testified by the final colour of the film after crystallisation. Conversely, the projecting parts are thicker.

After drying at 60° C. for a few minutes, the sample was put to crystallise in an oven, following the treatment already described. The result was a sample covered with a bright enamel, the colour of which reflects the thickness thereof. The flat parts are sky blue, corresponding to a thickness of 80-100 nm.

The crystalline structure was observed by X-ray diffraction with a beam of 2 mm×1 mm, with a size adapted to probe the flat part. The latter is well crystallised with the expected texture (direction [001]// to the normal of the surface and the direction [100] parallel to the direction <110> of the Ni), indicating that the corrugation did not cause interference on this area.

The structural characterisation of the corrugated part can be carried out conventionally only by flattening it in a press. On the other hand, the microdiffraction technique avoids this difficulty, which may introduce artefacts during flattening. Observation of the flattened sheet reveals a cubic texture of good quality (equivalent to that of the flat part) demonstrating that the corrugation created did not have any influence on the scale of the measurement, that is to say on a surface of some 2×1 mm$^2$. This does not exclude that distortions may exist on a micron scale on the tops of the projections, but the contribution thereof on average is indiscernible.

It is interesting to note that the flattening does not create excessive longitudinal cracking of the layer, which can be explained by its small thickness. However, short cracks perpendicular to the length of the sample were observed and were ascribable to dilatometric stresses.

The invention claimed is:

1. A method of depositing a buffer layer of epitaxial metal oxide on a textured metal substrate, said method comprising the steps of:
    (a) depositing on a textured metal substrate a layer of a precursor of an oxide of the formula $A_{2-x}B_{2+x}O_7$ where A is a metal of valence 3, B is a metal of valence 4, and x is a number between −0.1 and +0.1, wherein the metals are deposited from a carboxylate solution of said metals A and B maintained at a temperature of between 20° C. and 40° C., the solution having a viscosity, measured at the temperature of the solution, of between 1 mPa s and 20 mPa s;
    (b) drying said layer of oxide precursor on the metal substrate at a temperature of between 60° C. and 150° C.;
    (c) heating the dried metal substrate to a temperature sufficient to pyrolyse the oxide precursor to form the metal oxide, at least part of said heating being carried out under a flow of reducing gas having a flow rate greater than 0.005 cm/s.

2. The method of claim 1, wherein metal A is selected from the group consisting of La, Y, Gd, Dy, Lu, Sc, Nd, Sa and combinations thereof, and metal B is selected from the group consisting of Zr, Ti, Sn, Hf, Pb, Ce.

3. The method of claim 1, wherein the oxide precursor is $La_2Zr_2O_7$.

4. The method of claim 1, wherein the reducing gas is Argon containing 5% by volume $H_2$ and the flow rate is between 0.012 cm/s and 0.1 cm/s.

5. The method according to claim 1, the heating step (c) comprises a pyrolysis phase wherein the dried metal substrate is heated to a temperature between 150° C. and about 450° C., and a crystallisation phase wherein the dried metal substrate is heated to a temperature between about 450° C. and about 1100° C.

6. The method according to claim 1, wherein the heating step (c) comprises heating the dried metal substrate to a temperature of between 800° C. and 1100° C. to form the oxide.

7. The method according to claim 1, wherein the heating step (c) comprises increasing the temperature at a rate of between 100° C./h and 2000° C./h, maintaining the temperature at a selected temperature T for a period of between 1 and 120 minutes, and cooling at a rate of between 100° C./h and 2000° C./h to ambient temperature.

8. The method according to claim 1, wherein the heating step (c) comprises increasing the temperature at a rate of between 500° C./h and 2000° C./h, maintaining the temperature at a selected temperature T for a period of between 20 and 60 minutes, and cooling at a rate of between 100° C./h and 500° C./h to ambient temperature.

9. The method according to claim 5, wherein the pyrolysis phase is carried out at least partly at a reduced pressure.

10. The method according to claim 5, wherein the crystallisation phase is carried out under a flow of a reducing gas.

11. The method according to claim 1, wherein the metal substrate is an elongated metal substrate with a substantially circular or elliptical cross section, with a cubic texture having grains the direction [001] of which is perpendicular to the long direction of the substrate, and the direction [100] of which is parallel to the long direction of the substrate.

12. The method according to claim 1, wherein the metal substrate has grooves, corrugations or ribs.

13. A method of manufacturing a superconducting electrical conductor, said conductor comprising a layer of mixed rare earth-barium-copper oxide (REBaCuO) as a superconductor material deposited on a metal substrate having a substantially circular or elliptical cross section, said method comprising, in the order indicated, the following steps:
    (a) providing an elongated metal substrate having a substantially circular or elliptical cross section, said substrate having a face center cubic crystal structure and having grains oriented in the direction [001] perpendicular to the cylindrical axis of the substrate;
    (b) treating the external surface of the metal substrate by a functionalization treatment
    (c) depositing a buffer layer of epitaxial metal oxide on the functionalized external surface of the metal substrate by the method according to claim 1;
    (d) depositing a layer of REBaCuO on the metal oxide layer deposited in step (c);
    (e) depositing a metal protective layer on the layer of REBaCuO;
    (f) oxidizing the metal protective layer.

14. The method according to claim 13, wherein the functionalization treatment is performed using $H_2S$ at a pressure of between $10^{-3}$ and 10 bar.

15. The method according to claim 14, wherein the functionalization treatment is performed at atmospheric pressure.

16. The method according to claim 13, wherein the functionalization treatment of step (b) comprises the following steps:
    (i) heat treating the metal substrate under a vacuum by increasing the temperature of the substrate to between 550° C. and 650° C. at a rate of between 600° C./h and 1000° C./h, maintaining the temperature between 550° C. and 650° C. for approximately 30 minutes and then cooling the metal substrate to ambient temperature;
    (ii) flowing Argon containing approximately 0.1% by volume $H_2S$ over the metal substrate at atmospheric pressure for approximately 30 minutes; and then
    (iii) heat treating the metal substrate under a reducing gas comprising Argon and approximately 5% by volume $H_2$ by increasing the temperature of the substrate to between 750° C. and 900° C. at a rate of between 600° C./h and 1000° C./h, maintaining the temperature between 750° C. and 900° C. for approximately 30 minutes and then cooling the metal substrate to ambient temperature.

17. A superconducting electrical conductor with a substantially circular or elliptical cross section produced by the method of claim 13.

18. The superconducting electrical conductor of claim 17, wherein the temperature Tc is at least 83 K.

19. The superconducting electrical conductor of claim 18, wherein the current density of the conductor measured at a temperature of 4 K is greater than 3 Angstroms per centimeter of perimeter.

* * * * *